United States Patent
Takahashi

(10) Patent No.: US 8,431,030 B2
(45) Date of Patent: Apr. 30, 2013

(54) PROCESS FOR MANUFACTURING CRYSTAL RESONATOR

(75) Inventor: Takehiro Takahashi, Saitama (JP)

(73) Assignee: Nihon Dempa Kogyo Co., Ltd., Shibuya-Ku (JP)

( * ) Notice: Subject to any disclaimer, the term of this patent is extended or adjusted under 35 U.S.C. 154(b) by 406 days.

(21) Appl. No.: 12/802,290

(22) Filed: Jun. 3, 2010

(65) Prior Publication Data

US 2010/0314355 A1   Dec. 16, 2010

(30) Foreign Application Priority Data

Jun. 12, 2009  (JP) ................................ 2009-140797
May 19, 2010  (JP) ................................ 2010-114996

(51) Int. Cl.
*B44C 1/22* (2006.01)
(52) U.S. Cl.
USPC .................... 216/13; 216/41; 216/56; 216/83
(58) Field of Classification Search .......................... None
See application file for complete search history.

(56) References Cited

U.S. PATENT DOCUMENTS

| | | | | |
|---|---|---|---|---|
| 5,286,343 | A * | 2/1994 | Hui .................................. | 216/41 |
| 6,270,685 | B1 * | 8/2001 | Ishio et al. ......................... | 216/2 |
| 6,629,341 | B2 * | 10/2003 | Wilkie et al. ................. | 29/25.35 |
| 8,161,608 | B2 * | 4/2012 | Tashiro et al. ................ | 29/25.35 |
| 8,343,368 | B2 * | 1/2013 | Ogawa et al. ................... | 216/41 |
| 2010/0084948 | A1 * | 4/2010 | Katoh et al. ................... | 310/367 |

FOREIGN PATENT DOCUMENTS

JP    2002335142 A  * 11/2002

OTHER PUBLICATIONS

Japanese Unexamined Patent Publication No. 2008-131462, Jun. 5, 2008, Epson Toyocom Corp.
Japanese Unexamined Patent Publication No. 2002-335142, Nov. 22, 2002, Seiko Epson Corp.
Japanese Unexamined Patent Publication No. 2001-085966, Mar. 30, 2001, Toyo Commun. Equip. Co. Ltd.
Japanese Unexamined Patent Publication No. 2009-130586, Jun. 11, 2009, Epson Toyocom Corp.
Japanese Unexamined Patent Publication No. 2008-011278, Jan. 17, 2008, Nippon Dempa Kogyo Co., Ltd.
Japanese Unexamined Patent Publication No. 04-334108, Nov. 20, 1992, Seiko Epson Corp.
Japanese Unexamined Patent Publication No. 2003-273679, Sep. 26, 2003, Seiko Epson Corp.
Japanese Unexamined Patent Publication No. 2007-142526, Jun. 7, 2007, Epson Toyocom Corp.

* cited by examiner

*Primary Examiner* — Anita Alanko
(74) *Attorney, Agent, or Firm* — Edwards Wildman Palmer LLP; Scott D. Wofsy; Christopher J. Capelli

(57) ABSTRACT

There is provided a crystal resonator (crystal element) in which the probability of chipping occurring in separation is small when there is one supporting section with respect to a frame section of a crystal wafer, and inclined surfaces due to the anisotropy of etching are eliminated. The present invention relates to a crystal resonator manufacturing method such that an AT-cut crystal wafer is etched, a large number of rectangular crystal elements are joined with frame sections by supporting sections, and the crystal elements are mechanically cut away from the frame sections. On both sides of the +X-axis one end section of the crystal element, at least the outer side surface has a planarly tapered projection having a triangular inclined surface with an apex in the −X-axis direction, and the tip end of the projection has processing traces of the etching in the +X-axis direction.

6 Claims, 11 Drawing Sheets

PROCESS FOR MANUFACTURING CRYSTAL RESONATOR

BACKGROUND OF THE INVENTION

1. Technical Field

The present invention relates to a crystal resonator (crystal element) manufacturing method in which outer-shape processing is conducted on a crystal wafer, and in particular, to a crystal resonator manufacturing method in which the method of crystal cutting is an AT cut method and the influence of anisotropy of wet etching is eliminated.

2. Background Art

An AT-cut crystal resonator is a typical type of crystal resonator, and is used in a frequency band from approximately 2 to 100 MHz (fundamental wave) as a built-in frequency source in various types of electronic devices. In recent years, there is a demand for mass-producing/processing crystal elements from a crystal wafer using a photolithography technique and etching (photoetching) technique, in order to increase the productivity.

PRIOR ART

FIG. 6 to FIG. 8 are diagrams for describing a crystal element cutting method of a conventional example, wherein FIG. 6 is a cutting angle diagram of an AT-cut crystal plate (an AT-cut plate or AT plate), FIG. 7 is a partially cutaway plan view showing a crystal wafer with a mask provided therewith, and FIG. 8 is an enlarged view of an individual framed crystal element of FIG. 7 illustrated within a two-dot chain line frame. An AT-cut (AT plate) 1 of a crystal resonator is formed such that a Y-cut crystal plate (Y-cut plate or Y plate) 2 with the principle (main) surface orthogonal to the Y-axis of the crystal axes (XYZ), is rotated counterclockwise from the Z-axis about the center X-axis in the Y-axis direction by $\theta°$ (=35° 15'). Here, this is a right-handed crystal, and rotates counterclockwise with the +X-axis on the near side (refer to FIG. 6). In a case of a left-handed crystal, it is rotated in a similar manner with the −X-axis on the near side.

In this case, in general, the axes as a result of rotation about the crystal axes and the X-axis are referred to as Y'-axis and Z'-axis, and the crystal axes (coordinate axis) in an AT-cut is represented as (XY' Z'). Essentially, in a Y-cut, the principle surface of a crystal element is orthogonal to the Y-axis whereas in an AT-cut, the principle surface of a crystal element is orthogonal to the Y'-axis. Moreover the thickness of a crystal element 3, which determines the resonating frequency, is taken as the Y'-axis, and for example, the length and width thereof are respectively taken as the X-axis and Z'-axis.

Here, first, on both of the principle surfaces of a crystal wafer 4 cut out as an AT-cut wafer from an artificial crystal, there is formed, by means of vapor deposition or sputtering, a mask 5 composed of gold (Au) with chrome (Cr) serving as a foundation (refer to FIG. 7). Next, having coated a photoresist and exposed it to light, a region on the crystal wafer 4 that needs to be removed is exposed by means of wet etching. Here, the rectangular crystal element 3, a frame section 6 that surrounds the outer periphery thereof, and a supporting section 7 that joins both of these, are covered by the mask 5, and other regions are exposed.

The supporting section 7 shown in FIG. 7 joins with the frame section 6 at the lengthwise (X-axis) one end (one end section) of the crystal element 3, and has a constricted part, which facilitates cutting. In this case, the lengthwise (X-axis) one end (one end section) of the crystal element 3, on which the supporting section 7 is formed, is taken as the +X-axis, and the other end side (the other end section) is taken as the −X-axis. The Z-axis (optical axis) and the Y-axis (mechanical axis) of the crystal basically have no polarity (±), and only the X-axis serving as an electrical axis has a polarity (±).

Next, for example, by means of hydrogen fluoride etching, the exposed portion of the crystal wafer 4 is removed and the outer-shape processing is conducted, to thereby obtain a large number of individual crystal elements 3 joined with the frame sections 6. Next, for example, the mask 5 formed on both of the principle surfaces of the crystal wafer 4 is removed, and similarly by means of vapor deposition or the like, for example, an exciting electrode with a lead-out electrode (not shown in the drawing) extending therefrom is formed on both sides of the one end section of the crystal element 3. The exciting electrode with the lead-out electrode extending therefrom can be formed in the process of etching the mask 5. However, the etching in the outer-shape process of the crystal element causes roughness on the Au surface, and therefore an exciting electrode is formed again by means of vapor deposition or the like.

Finally, the supporting section 7 is mechanically cut away from the frame section 6, using a breaking jig, to thereby obtain individual crystal elements 3 with the X-axis taken as the length, the Z'-axis taken as the width, and the Y'-axis taken as the thickness. Then for example, both sides of the one end section from which the lead-out electrode extends, are fixed on the inner bottom surface of the container main body (not shown in the drawing) having a concaved sectional shape, and the opening end surface of the container main body is sealed with a cover, to thereby seal-enclose the crystal element 3. On the outer bottom surface of the container main body, there is provided a mount terminal. (Refer to Patent Document 1: Japanese Unexamined Patent Publication No. 2008-131462)

PROBLEMS IN PRIOR ART

However, in a crystal resonator manufactured by the conventional manufacturing method above, as shown in FIG. 9, the respective opposite surfaces on both sides of the one end section of the crystal element 3 become diagonally symmetric due to the anisotropy of etching, and triangular inclined surfaces P1 and P2 with the apex thereof on the −X-axis side are formed. FIG. 9 is a perspective view of the crystal element 3 seen from the one end (a perspective view in the A-A sectional direction in FIG. 8).

That is to say, the etching rate with respect to the crystal axes (XYZ) due to the anisotropy of etching is in an order of Z>>+X>−X>Y. Here +X is a rate of etching from the +X-axis towards the −X-axis direction, and −X is a rate of etching from the −X-axis towards the +X-axis direction. In this example, the crystal element 3 is an AT-cut crystal element, and therefore the rate of etching in the Z-axis direction (tilted axis), which is tilted by 35° 15' from the normal line (Z'-axis) with respect to the principle surface of the crystal element 3, is the highest rate.

Accordingly, in the region shown in FIG. 10A where the crystal wafer 4 is exposed through the mask 5, first, etching progresses most from both of the principle surface sides in the Z-axis direction, which is the tilted axis with respect to the principle surface of the crystal element 3, and it then progresses towards the −X-axis direction. Thereby, as shown with solid lines and dotted lines in FIG. 8, the triangular inclined surfaces P1 and P2, which begin from both of the end sections on one end of the crystal element 3 and which respectively incline from both of the principle surfaces, progress towards the center region of the crystal element 3.

Thereby, at the time of completion of etching where the exposed portion has been pierced through (refer to FIG. 10A), as described above, on the lower surface of the mask 5 on the both sides of the one end section of the crystal element 3, there are respectively formed the triangular inclined surfaces P1 and P2, which are diagonally symmetric on the opposite surfaces (refer to FIG. 9). Also at the supporting section 7, etching is similarly conducted along the Z-axis direction on both of the side surfaces of the crystal element 3 (refer to FIG. 10C). FIG. 10A and FIG. 10B are A-A cross-sectional views of FIG. 8, and FIG. 10C is a B-B cross-sectional view of FIG. 8.

In this case, for example, if an exciting electrode 8 shown with the two-dot chain line in FIG. 11 is formed across between the inclined surfaces P1 and P2, unwanted resonance and so forth may occur. Therefore, the electrode area of the exciting electrode 8 inevitably needs to be made small, and it causes, in particular, a problem in that crystal impedance (CI) increases. These become more significant particularly as the resonating frequency is increased to a higher frequency, or as the planar outer shape of the crystal element 3 becomes smaller accompanying miniaturization.

Consequently, as shown in Patent Document 1 for example, projecting sections 9 (*a, b*) that join with the frame section 6 are provided on both sides of the one end section of the crystal element 3 (refer to FIG. 1 of the present application). Accordingly, it is proposed to eliminate the influence of the anisotropy of etching, and not form the inclined surfaces on the crystal element 3 after separating it from the frame section 6, but form parallel flat surfaces. However, in this case, the supporting section 7 is removed as two sections at both ends of the one end section of the crystal element 3 after etching has been conducted. Therefore, the probability of chipping occurrence increases when mechanically separating it from the frame section 6. Moreover there is a problem in that chipping of greater size and number leads to a greater level of influence on the retention of the electrically conductive adhesive agent and consequently degrades the resonating characteristic.

PURPOSE OF THE INVENTION

An object of the present invention is to provide a method of manufacturing a crystal resonator (crystal element) in which the inclined surface due to the anisotropy of etching is made small and defects in the corner sections are prevented.

SUMMARY OF THE INVENTION

The present invention is a method of manufacturing a crystal resonator in which: on both principle surfaces of an AT-cut crystal wafer, there is formed a mask that corresponds to a large number of rectangular crystal elements and to frame sections that are respectively joined with the crystal elements by supporting sections and respectively surround the crystal elements, and etching is conducted, to thereby obtain a crystal wafer in which a large number of the crystal elements are joined with the frame sections by the supporting sections; and then the crystal elements are mechanically cut away from the frame sections, wherein: the mask, together with the crystal element and the frame section including the supporting section, has a projecting section, which extends in a +X-axis direction, on both end sections on a +X-axis one end of the crystal element; a crystal wafer, in which the large number of crystal elements joined with the frame sections by the supporting sections, is obtained by means of etching; the projecting sections of the crystal element corresponding to the mask are distanced from the frame section at least after the etching has been conducted; and the etching is conducted while forming triangular inclined surfaces with apexes on the tip end of each corner section of mutually opposite surfaces, between both sides of the one end section.

EFFECT OF THE INVENTION

According to this type of configuration, on both sides of the +X-axis one end section of the crystal element, there is provided the mask that corresponds to the projecting sections extending in the −X-axis direction. Consequently, as with the conventional example, etching from both sides of the one end section of the crystal element (rectangular) is prevented. Moreover the crystal element is etched from the tip end of the projecting section extending in the +X-axis. Therefore, after the outer-shape processing of the crystal element by means of etching has been completed (at the time of completion), the triangular inclined surfaces due to the anisotropy of etching in both of the corner sections of the crystal element can be made small. Furthermore the projecting sections on both sides of the one end sections are distanced from the frame section after etching. Therefore, they do not need to be mechanically separated from the frame section after the etching. Consequently, mechanical separation only occurs at the supporting section, and therefore the probability of chipping occurring in the crystal element becomes small.

In the present invention, the projecting sections of the first mask join with the frame section, and are made smaller than the width of the supporting section. Thereby, when etching the crystal wafer, in a state where the supporting section is joined with the frame section, the etching is conducted while forming the triangular inclined surfaces with projecting sections separated from the frame section and the tip ends of the respective corner sections as the apex. Therefore, after the etching of the crystal element has been conducted, the inclined surfaces on both sides of the one end section of the crystal element (rectangular) become small.

Moreover, in the present invention, the projecting sections of the first mask are preliminarily made distanced from the frame section. Also in this case, etching is conducted while forming triangular inclined surfaces with the apexes on the tip ends of the respective corner sections on both sides of the one end section where the projecting sections are provided. Therefore, after the outer-shape processing of the crystal element by means of etching, the size of the inclined surfaces on both sides of the one end section becomes small.

Furthermore, in the present invention, on both sides of the +X-axis one end section of the crystal element, the projecting sections are etched, and a planarly tapered projection, which has the triangular inclined surface with the apex thereof in each of the corner sections, remains. In this case, the projecting section has the etched remaining projection, and therefore, the inclined surface in both of the corner sections in the rectangular region of the crystal element can be made even smaller.

Moreover, in the present invention, the projecting section on both sides of the +X-axis one end section of the crystal element is etched, and the triangular inclined surface having each of the corner sections serving as the apex thereof is formed within a rectangular region of the crystal element. Also in this case, the inclined surface is formed from the tip end of the projecting section, and therefore, the inclined surface becomes small after etching the crystal element.

Furthermore, in the present invention, the crystal element joins with the frame section in the center section of the +X-axis one end section. Thereby, the position of the supporting section is defined. However, in addition to this, the position of the supporting section may be positioned on any periphery part of the crystal element.

BRIEF DESCRIPTION OF THE DRAWINGS

FIG. 5 includes plan views for describing another embodiment of the present invention, showing a framed crystal element with a mask formed thereon, wherein

DETAILED DESCRIPTION OF PREFERRED EMBODIMENT

Hereunder, one embodiment of a crystal resonator manufacturing method of the present invention is described, with reference to FIG. 1 to FIG. 4. The same reference numbers are given to portions the same as those in the aforementioned conventional example, and descriptions thereof are simplified or omitted.

Figure 6:
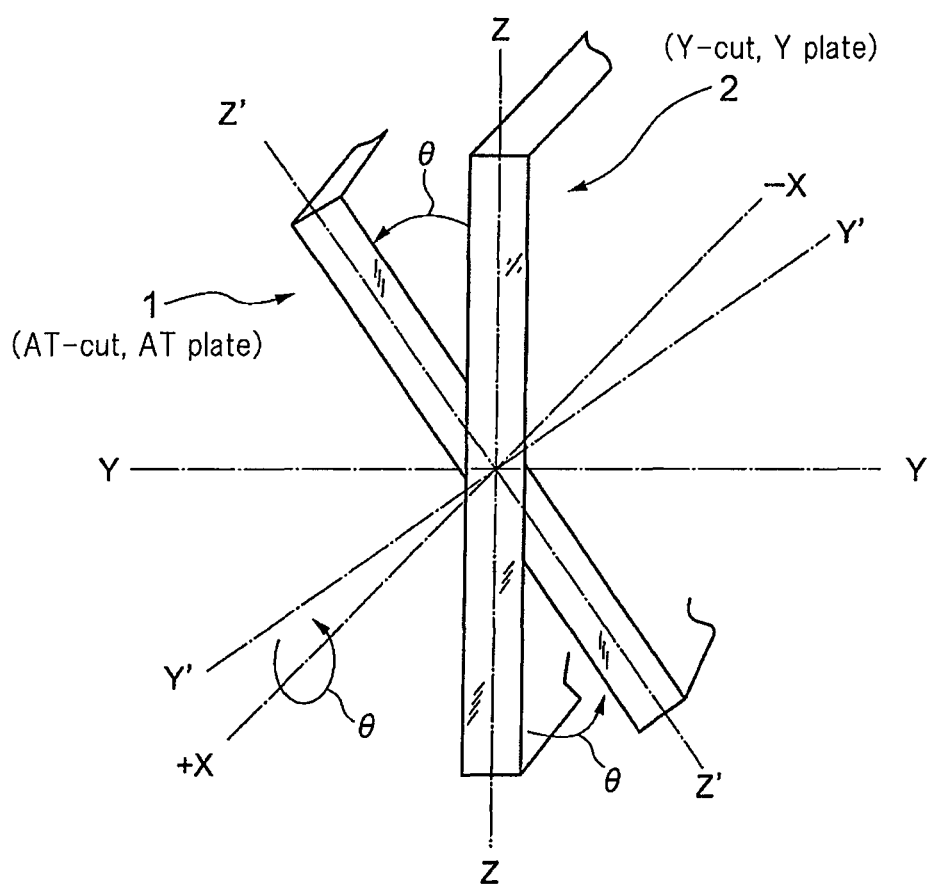
FIG. 6 is a cutting angle diagram of an AT-cut crystal plate (AT-cut plate or AT plate).
Figure 7:
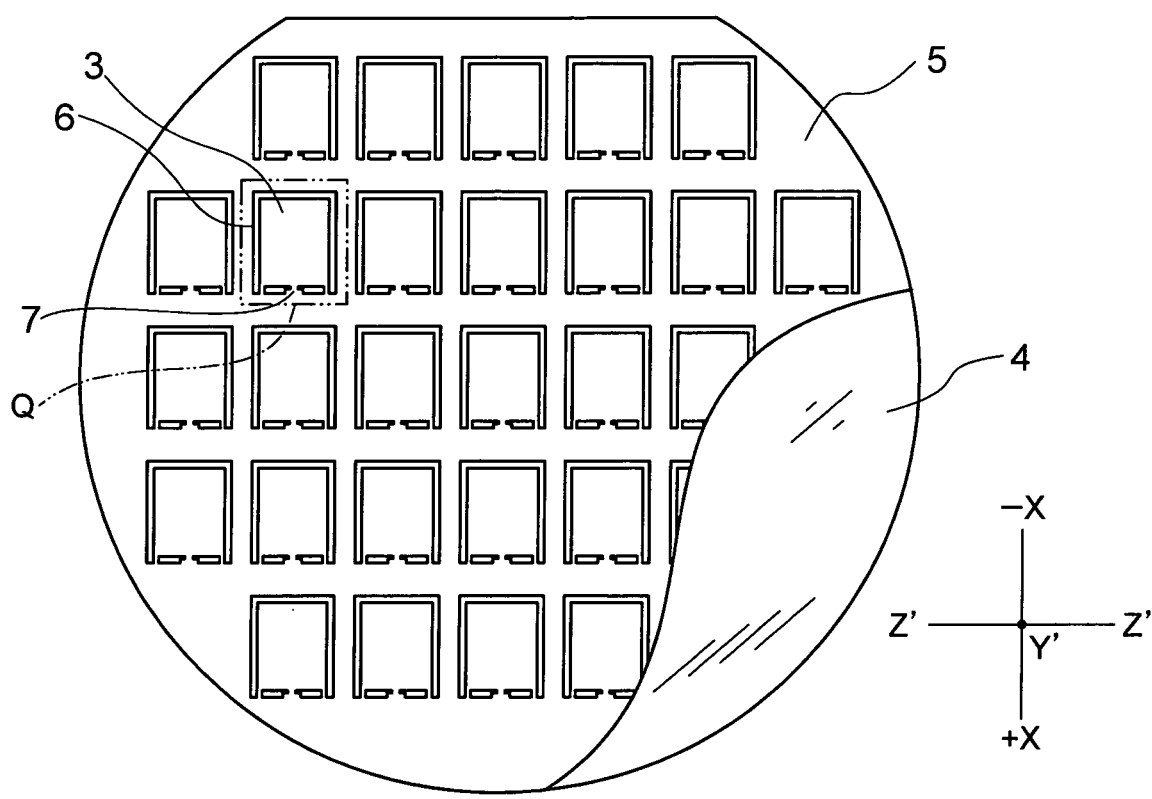
FIG. 7 is a plan view for describing a conventional method of manufacturing a crystal resonator, showing a crystal wafer with a mask provided thereon in a partially cutaway view.
Figure 8:
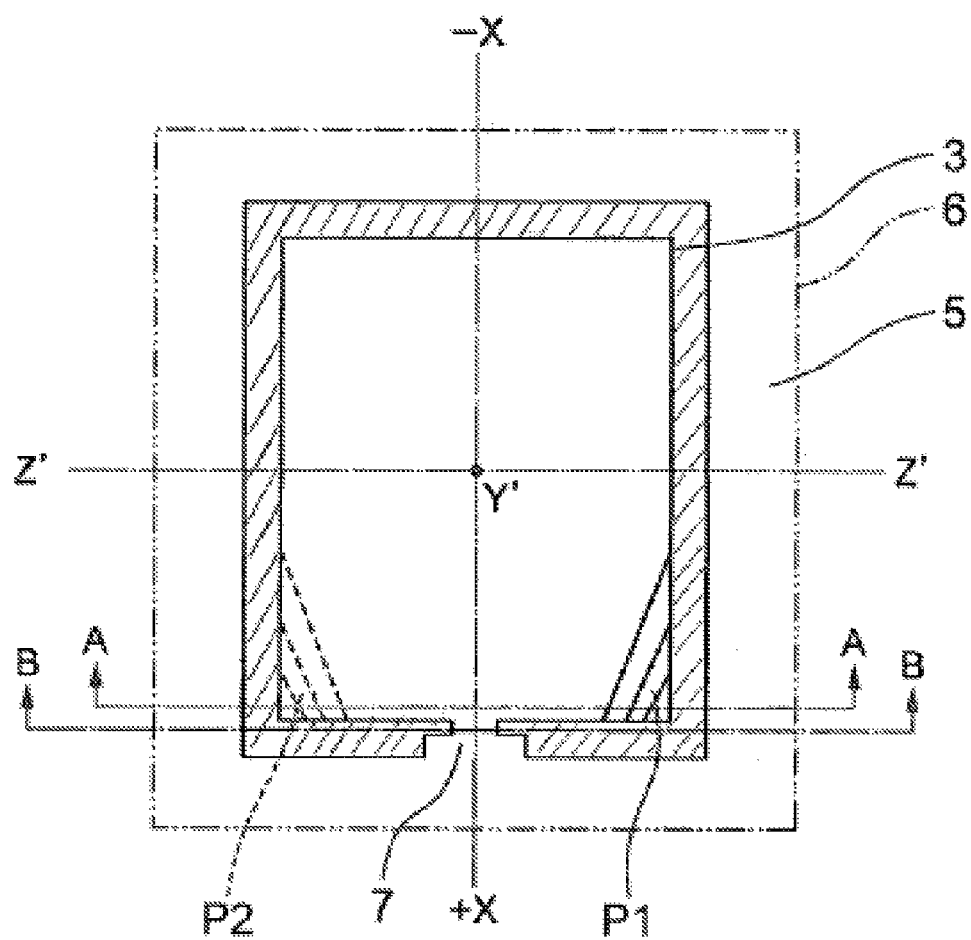
FIG. 8 is a drawing for describing the conventional method of manufacturing a crystal resonator, showing an enlarged view of the framed crystal element having a mask illustrated with the dot-line frame Q in FIG. 7 before etching.
Figure 9:
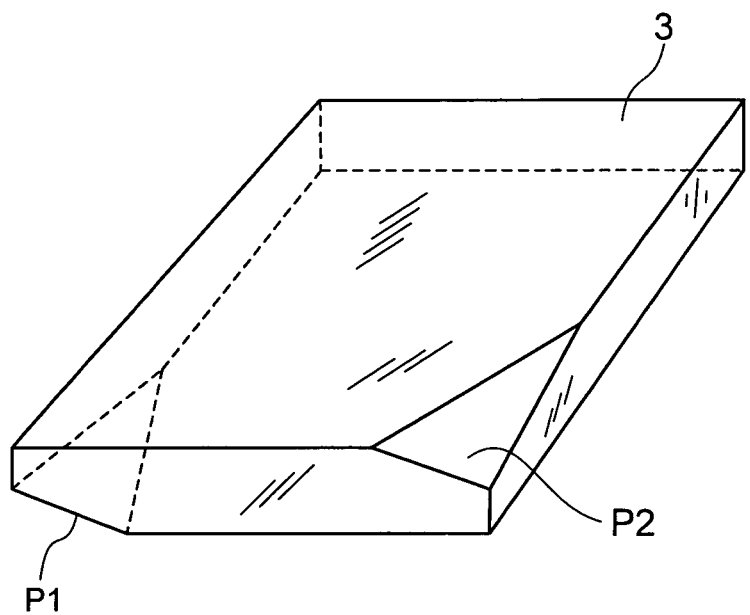
FIG. 9 is a perspective view of the crystal element seen from the direction of the A-A arrows in FIG. 8.
Figure 10A:
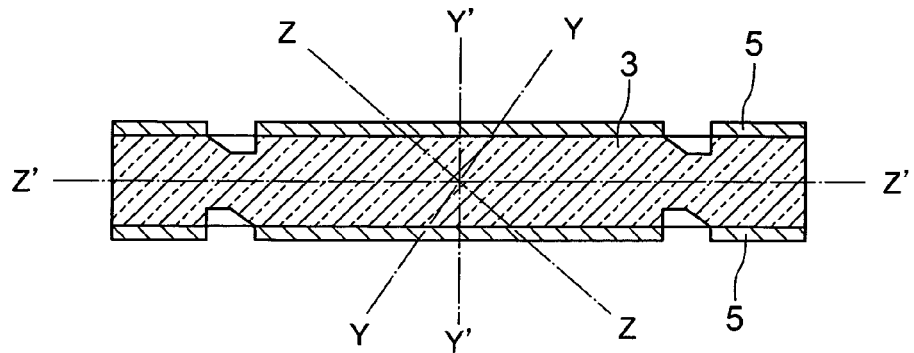
FIG. 10 includes drawings for describing the conventional method of manufacturing a crystal resonator, wherein FIG. 10 (A, B) are A-A cross-sectional views of FIG. 8.
FIG. 10C is a B-B cross-sectional view of FIG. 8.
Figure 10B:
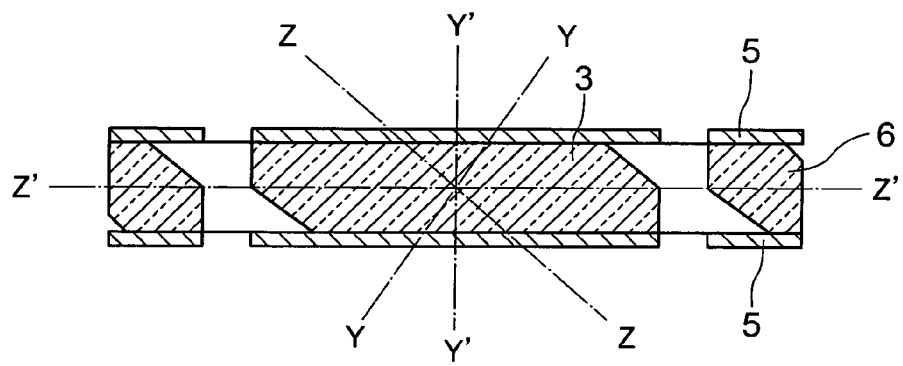
Figure 10C:
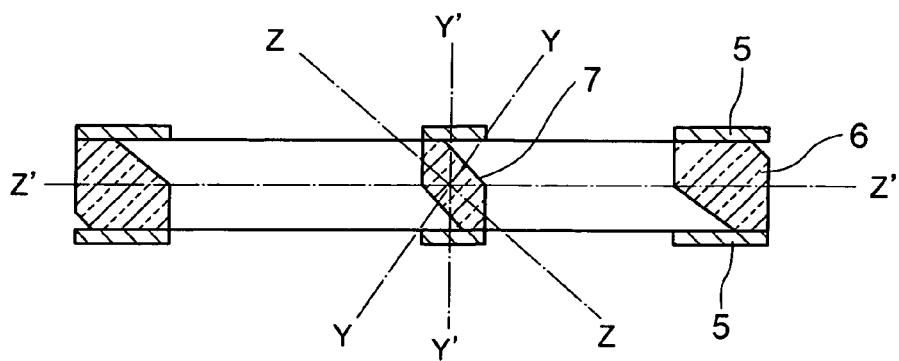
Figure 11:
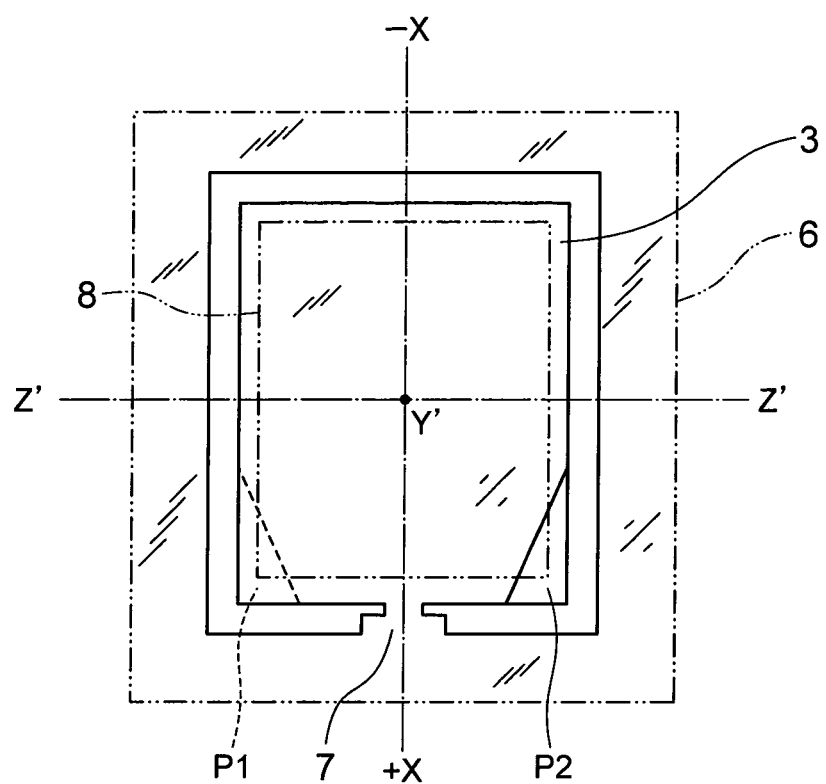
FIG. 11 is a drawing for describing the conventional method of manufacturing a crystal resonator, showing an enlarged view of the framed crystal element with the post-etching mask illustrated with the dot-line frame Q in FIG. 7 removed.

As mentioned above, a crystal resonator (crystal element) is an AT-cut element in which the principle surface thereof is orthogonal to the Y'-axis of the coordinate axis (XY'Z') rotated about the X-axis of the crystal axis (XYZ). Moreover a large number of crystal elements 3 with a processed outer shape including a lead-out electrode and exciting electrode, are obtained by conducting photoetching on a crystal wafer 4 (refer to FIG. 6 to FIG. 8). Having conducted the outer-shape processing of the crystal element, an exciting electrode and lead-out electrode (not shown in the drawings) are formed on the principle surface of the crystal element by means of photoetching. However, these electrodes may also be formed by means of vapor deposition or sputtering after having separated the crystal element 3.

Figure 1:
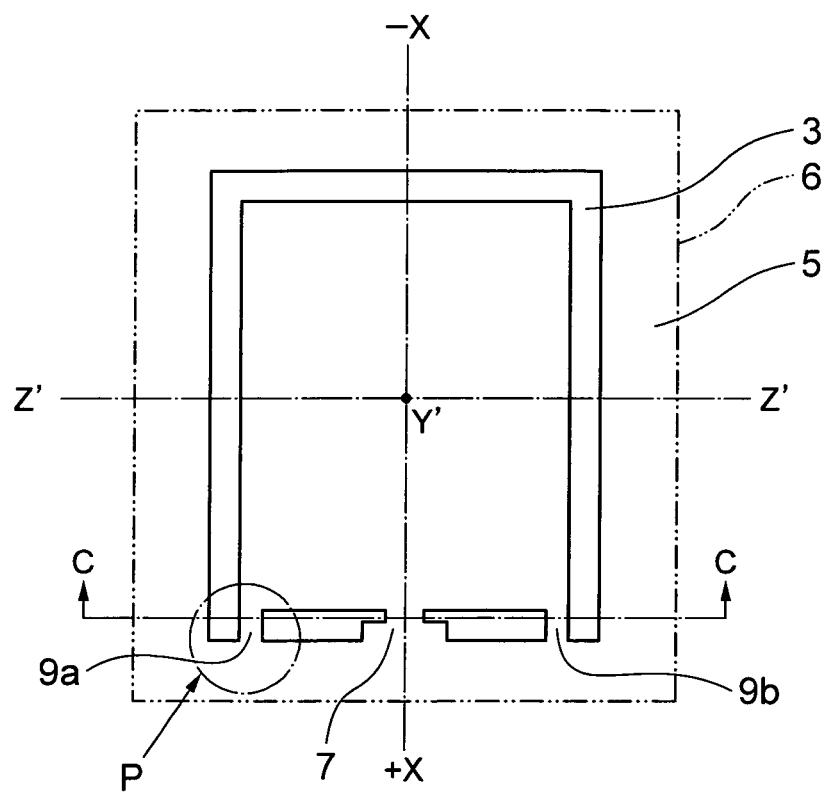
FIG. 1 is a plan view for describing one embodiment of a method of manufacturing crystal resonator of the present invention, showing a framed crystal element, which is part of a crystal wafer before etching with a mask formed thereon.

In this embodiment, as shown in FIG. 1, a mask 5 coated on the crystal wafer 4 covers the crystal element 3, a frame section 7, and a supporting section 7 in a manner similar to that described above. The supporting section 7 is formed so as to have a constricted part in the center section on the +X-axis one end of the crystal element 3 as described above. Here, along with the crystal element 3 and the frame section 6 including the supporting section 7, there is provided a mask 5 that covers these so as to correspond to first and second projecting sections 9 (a, b). The first and second projecting sections 9 (a, b) extend in the +X-axis direction from both sides of the +X-axis one end section (both sides of one end section) of the crystal element 3, where the supporting section 7 is formed. In this example, the first and second projecting sections 9 (a, b) respectively join with the frame section 6, and the width of both of them is made smaller than the width (Z-axis direction) of the supporting section 7. The crystal wafer 4 with the mask 5 formed in this way is etched using hydrogen fluoride in a similar manner to that described above.

In this type of configuration, when etching on the crystal wafer 4 including removal of the mask 5 has been completed, the crystal element 3 is joined with the frame section 6 by the supporting section 7 on the one end (+X-axis side). On both end sections on the one end of the crystal element 3, the first and second projecting sections 9 (a, b) are separated from the frame section 6 by means of etching and there remain projections 10 with the tip ends planarly tapered. The projections 10 here are of a planarly right-angled triangular shape in which the corner section is a right-angle and the hypotenuse, which is the opposite side, is on the inner periphery side (refer to FIG. 2 and FIG. 4 described later).

Figure 2:
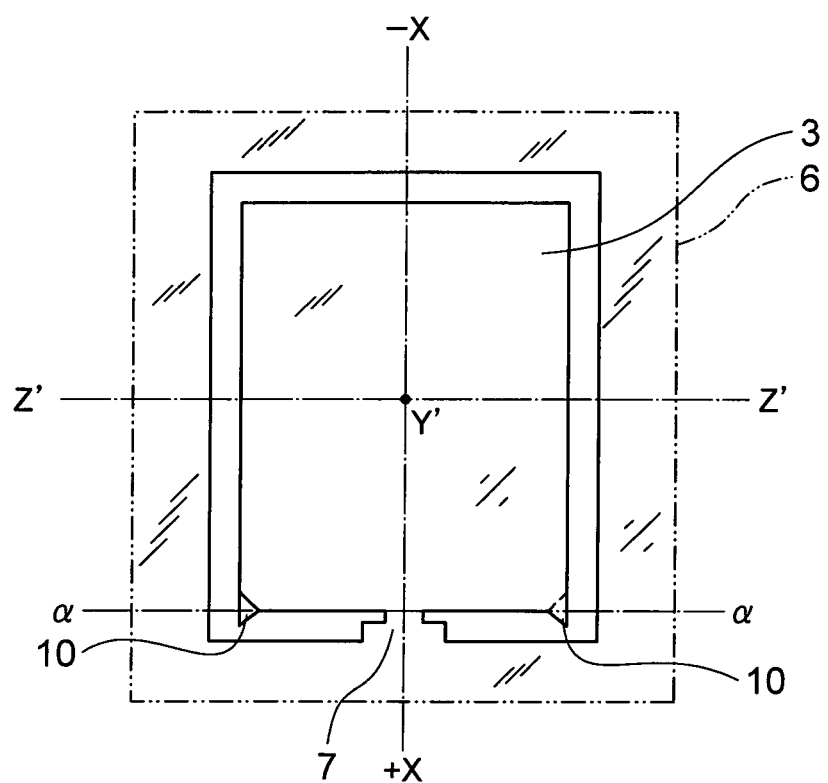
FIG. 2 is a plan view for describing the one embodiment of the present invention, showing the framed crystal element with the mask removed after etching.

In this case, on the tip end of the projections 10, there remain process traces caused by the etching in which the projecting sections 9 (a, b) are separated from the frame section 6. The line α-α in FIG. 2 is an imaginary line showing that the projection 10 is of a planarly right-angled triangular shape. Moreover the projections 10 are diagonally symmetric between both principle surfaces of the crystal element 3, and a triangular inclined surface similar to that described above is formed from the tip end of each of the projections 10. Essentially, the cause of this is that the etching is conducted while forming the triangular inclined surfaces, with, as the apex, the tip ends (the tip ends of the respective corner sections) that become the outside of the projecting sections 9 (a, b) that become mutually opposite surfaces between both sides of the one end section of the crystal element 3, and are separated from the frame section 6.

Figure 3A:
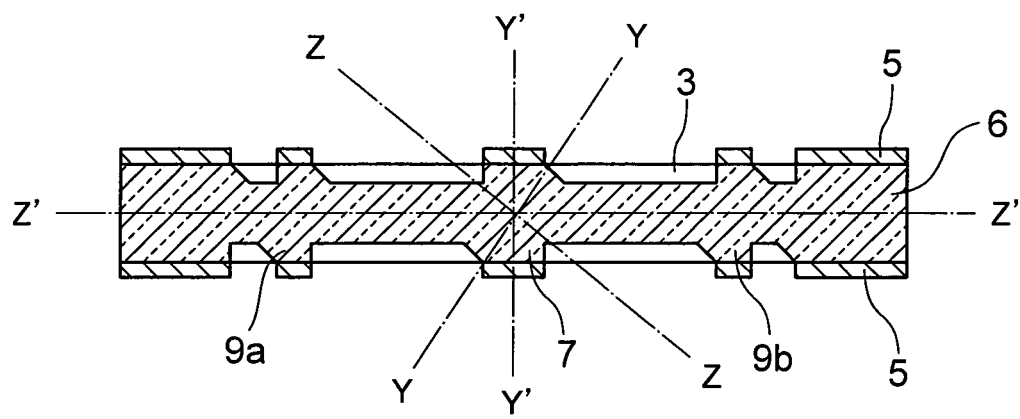
FIG. 3 includes drawings of the framed crystal element showing etching states of the one embodiment of the present invention, wherein FIG. 3 (A, B) are cross-sectional views taken along the line C-C in FIG. 1.
Figure 3B:
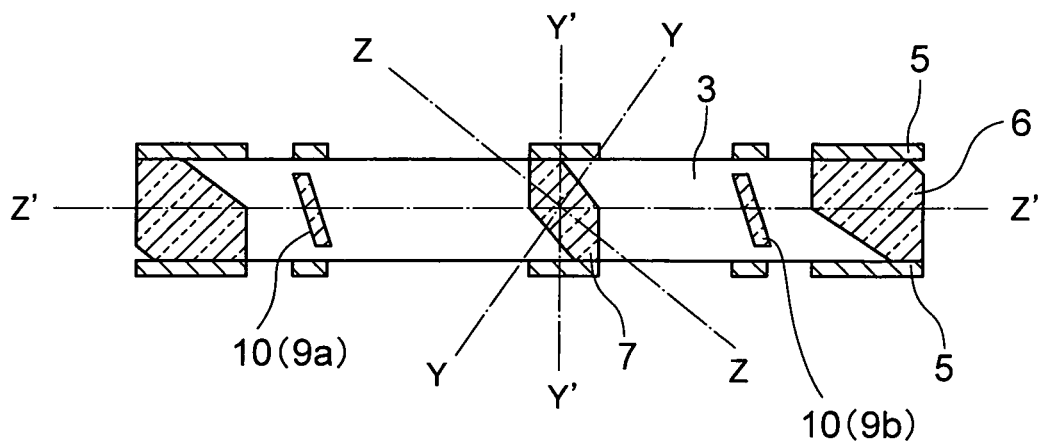

That is to say, as shown in FIG. 3 (cross-sectional view taken along the line C-C in FIG. 1), in the initial state of etching, in the region between the supporting section 7 and the first and second projecting sections 9 (a, b) where the crystal is exposed, etching progresses in the Z-axis direction in which a highest etching rate is observed (FIG. 3A). Then the exposed part of the crystal is penetrated through between the mask 5 (FIG. 3B).

In this case, the width of the first and second projecting sections 9 (a, b) is narrower than the width of the supporting section 7, and it is etched in the Z-axis direction and also in the direction from the +X-axis to the −X-axis. Therefore, the first and second projecting sections 9 (a, b) with narrower width, are separated from the frame section 6, while the projections 10 remain. However, the supporting section 7 with the wider width is joined with the frame section 6 as described above without being separated from the crystal element 3.

Figure 4:
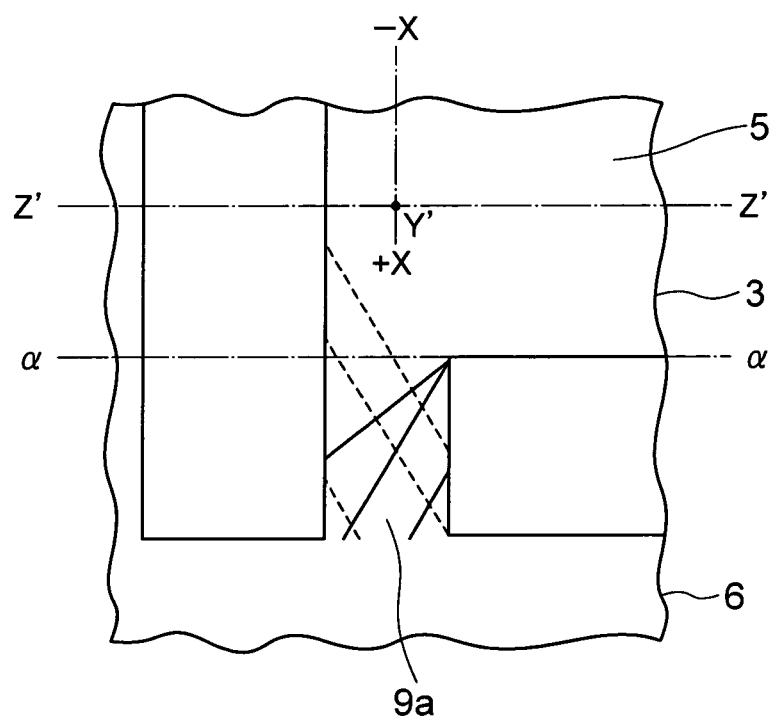
FIG. 4 is a part view of the framed crystal element for describing the one embodiment of the present invention, showing an enlarged plan view of a region illustrated with the dot-line frame in FIG. 1.

Here, as shown in FIG. 4 (an enlarged view of the portion illustrated with the dot-line frame P in FIG. 1), for example with the first projecting section 9a as an example, in the exposed part of the crystal between the mask 5, etching is conducted from both of the principle surfaces of the crystal element 3 in the Z-axis direction and also in the direction from the +X-axis to the −X-axis. Therefore, on both sides in the Z'-axis direction of the first projecting section 9a, from the corner section with the frame section 6 as a starting point, the triangular inclined surfaces similar to that described above are formed from both of the principle surfaces while etching progresses (refer to the solid lines and dotted lines in FIG. 4).

On the outer periphery side of the first projecting section 9a (on the left side of FIG. 4), etching progresses while keeping the same wavefront (illustrated with dotted lines) of etching progression (dotted lines are parallel from the starting point) since the outer periphery side is a straight line. In contrast, on the inner periphery side of the first projecting section 9a (on the right side of FIG. 4), when etching progresses from the starting point and the wavefront of etching progression illustrated with the solid lines reaches the corner section of the mask 5 that covers the crystal element 3, etching towards the −X-axis direction is obstructed by the mask 5.

Consequently, the wavefront of etching progression (solid lines) becomes a wavefront that has rotated from the starting point at the corner section of the mask 5 that covers the crystal element 3. The planar shape of the projection 10 becomes, as described above, a right-angled triangle in which the opposite side that subtends the right angle, on the outer periphery orthogonal to the imaginary line α-α, is on the inner periphery side. Here, also for the second projecting section 9b, the right-angled triangular projection 10 is formed in a similar manner.

Accordingly, in the present embodiment, the projections 10 are formed on both end sections on the one end of the crystal element 3 by the first and second projecting sections 9 (a, b) provided on both of the end sections on the +X-axis one end of the crystal element 3 when the outer-shape processing of the crystal element 3 by means of etching has been completed. Furthermore the diagonally symmetric inclined surfaces on both of the principle surfaces formed in a triangular shape from the +X-axis side when conducting etching, which were mentioned in the conventional example, are, in the embodiment of the present invention, formed from the +axis side of the first and second projecting sections 9 (a, b) joined with the frame section 6. Therefore, the inclined surfaces formed on both of the end sections of the crystal element 3, excluding the projections 10, can be made small.

Accordingly, the flat surface area on both of the principle surfaces of the crystal element 3 can be made large, and the size of the exciting electrode to be formed thereon can also be made large. Since only one supporting section 7, which is bound with the frame section 6, is formed in the center section of the crystal element 3, it is possible to prevent chipping that occurs when mechanically separating the crystal element 3 from the frame section 6 after etching. Therefore, resonating characteristics including crystal impedance (CI) can be maintained at a superior level.

Figure 5A:
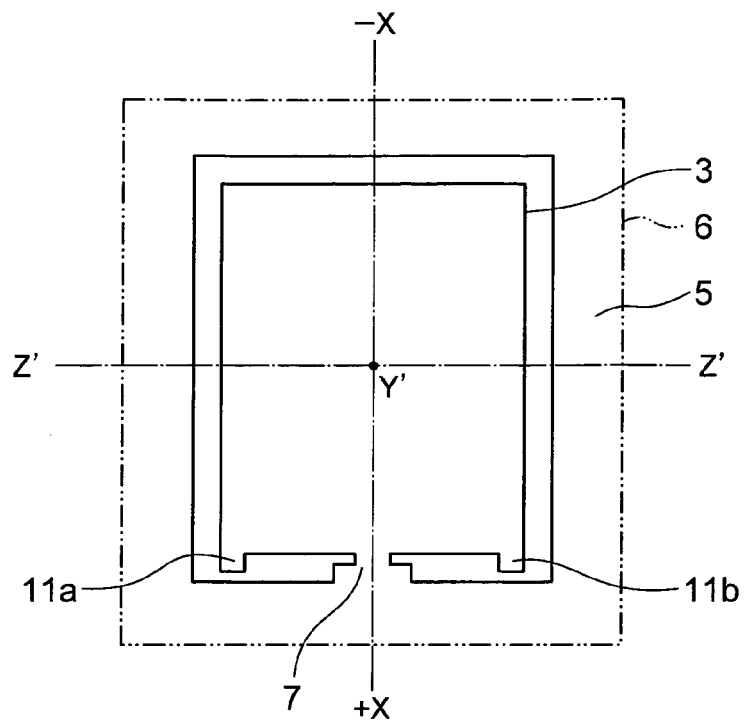
FIG. 5A is a plan view of the framed crystal element with the mask formed thereon, and FIG. 5 B is a plan view of the framed crystal element with the mask removed.

In the above embodiment, the projections 10 are formed on both of the end sections on the one end of the crystal element 3 using the mask 5 with the first and second projecting sections 9 (a, b) joined with the frame section 6, however, they may also be formed as illustrated in FIG. 5A for example. That is to say, the mask 5 may be such that first and second projecting sections 11 (a, b) do not join with the frame section 6 and are preliminarily made distanced from the frame section 6 so as to simply project. Even in this case, after conducting etching, projections 10 in a substantially planarly triangular shape can be obtained as with the above embodiment. On both sides of the one end section of the crystal element 3, the projections 10 may have a simple triangular-shaped inclined surface instead of a planarly triangular shape, depending on the shape of the mask 5.

Figure 5B:
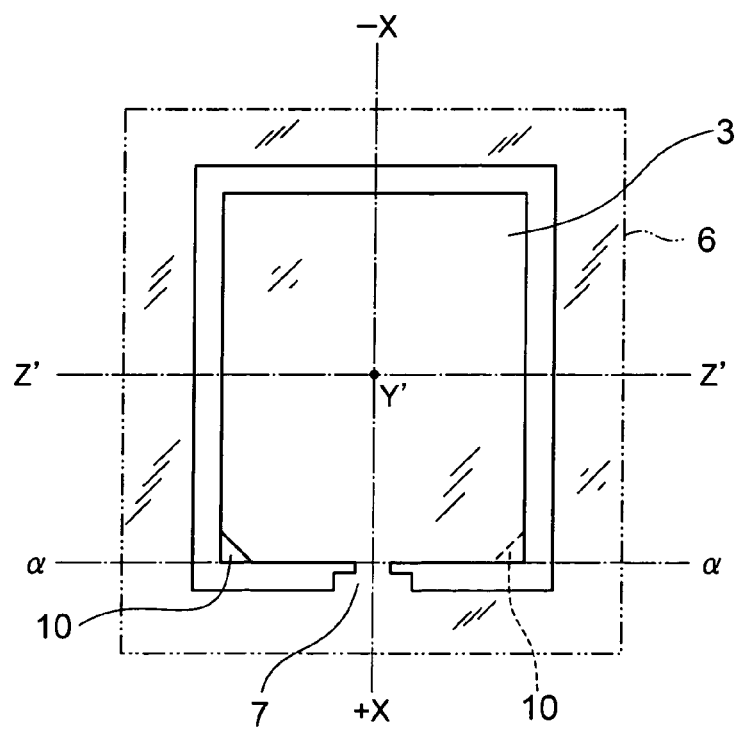

Moreover, the planarly triangular projections 10 are provided on both sides of the one end section of the crystal element 3. However, as shown in FIG. 5B for example, etching may be progressed further to eliminate the projections 10, and the triangular inclined surfaces having the respective corner sections on both sides of the one end section of the rectangular crystal element 3 may be formed in a rectangular region. Also in this case, the inclined surfaces are formed from the +X-axis outside corner section which becomes the tip end of the projecting sections 9 (a, b) separated from the frame section 6 by means of etching, or the tip end of the preliminarily separated projecting sections 11 (a, b). Therefore the area of the inclined surfaces becomes small after etching the crystal element 3.

What is claimed is:

1. A method of manufacturing a crystal resonator in which:
    forming a mask on both principle surfaces of an AT-cut crystal wafer that corresponds to a plurality of rectangular crystal elements and to frame sections that are respectively joined with said crystal elements by supporting sections and respectively surround said crystal elements, and
    etching is conducted, to thereby form a crystal wafer in which a plurality of the crystal elements are joined with the frame sections by the supporting sections; and said crystal elements are mechanically cut away from the frame sections, wherein: said mask, together with said crystal element and the frame section including the supporting section, has a projecting section, which extends along a +X-axis direction, from both side sections along the +X-axis on one end of said crystal element wherein each projecting section has first and second side walls joined by an end wall; such that a crystal wafer, in which the plurality of crystal elements joined with the frame sections by the supporting sections, is obtained by said means of etching; the projecting sections of the crystal element corresponding to said mask are separated from said frame sections at least after the etching has been conducted; and the etching is conducted while forming triangular inclined surfaces with the apexes on the tip end of each corner section of mutually opposite surfaces, between both sides of the one end section.

2. A method of manufacturing a crystal resonator according to claim 1, wherein the projecting sections of said first mask join with said frame section, and the width of said projecting sections is narrower than the width of said supporting section.

3. A method of manufacturing a crystal resonator according to claim 1, wherein the projecting sections of said first mask are preliminarily made separated from said frame section, and etching is conducted while forming triangular inclined surfaces with apexes on the tip ends of the respective corner sections on both sides of one end section where said projecting sections are provided.

4. A method of manufacturing a crystal resonator according to claim 1, wherein on both sides of the +X-axis one end section of said crystal element, said projecting sections are etched, and a planarly tapered projection, which has the triangular inclined surface with the apex thereof in each of the corner sections, remains.

5. A method of manufacturing a crystal resonator according to claim 1, wherein said projecting section on both sides of the +X-axis one end section of said crystal element is etched, and the triangular inclined surface having each of the corner sections serving as 5 the apex thereof is formed within a rectangular region of said crystal element.

6. A method of manufacturing a crystal resonator according to claim 1, wherein said crystal element joins with said frame section in the center section of the +X-axis one end section.

\* \* \* \* \*